US012691678B2

(12) United States Patent
Harada

(10) Patent No.: US 12,691,678 B2
(45) Date of Patent: Jul. 28, 2026

(54) INKJET HEAD DRIVING CIRCUIT THAT AVOIDS UNWANTED HIGH-FREQUENCY ACTUATOR VIBRATION

(71) Applicant: RISO Technologies Corporation, Tokyo (JP)

(72) Inventor: Sota Harada, Mishima (JP)

(73) Assignee: RISO Technologies Corporation, Tokyo (JP)

( * ) Notice: Subject to any disclaimer, the term of this patent is extended or adjusted under 35 U.S.C. 154(b) by 79 days.

(21) Appl. No.: 18/664,168

(22) Filed: May 14, 2024

(65) Prior Publication Data

US 2025/0074043 A1 Mar. 6, 2025

(30) Foreign Application Priority Data

Sep. 6, 2023 (JP) ................................. 2023-144330

(51) Int. Cl.
  *B41J 2/045* (2006.01)
  *H03K 17/30* (2006.01)
(52) U.S. Cl.
  CPC ......... *B41J 2/0455* (2013.01); *B41J 2/04541* (2013.01); *B41J 2/04548* (2013.01);
  (Continued)
(58) Field of Classification Search
  CPC .. B41J 2/0455; B41J 2/04541; B41J 2/04548; B41J 2/04581; B41J 2/04588; H03K 17/302
  (Continued)

(56) References Cited

U.S. PATENT DOCUMENTS

2003/0038615 A1* 2/2003 Elbanhawy ......... H02M 3/1584
                                                323/282
2014/0049574 A1* 2/2014 Hiyoshi ............... B41J 2/04581
                                                347/10
(Continued)

FOREIGN PATENT DOCUMENTS

CN      111746117 A    10/2020
JP      H09164677 A     6/1997

OTHER PUBLICATIONS

Extended European Search Report dated Feb. 6, 2025, mailed in counterpart European Application No. 24196489.9, 9 pages.

(Continued)

*Primary Examiner* — Mark Edwards
(74) *Attorney, Agent, or Firm* — Kim & Stewart LLP

(57) ABSTRACT

According to one embodiment, an inkjet head driving circuit includes a waveform pattern generation unit configured to generate a waveform pattern based on input data and a driving waveform generation unit configured to generate a driving waveform for driving an actuator of an inkjet head based on the generated waveform pattern. The driving waveform generation unit includes a power source configured to supply a driving voltage for the actuator, a plurality of switch elements for connecting the power source to the actuator, and a driving waveform output unit that outputs the driving waveform to the actuator by switching of the plurality of switch elements based on the waveform pattern. The waveform pattern changes the number of switch elements that are turned on in a section of the driving waveform within one cycle of the driving waveform for causing the actuator to eject an ink droplet.

15 Claims, 11 Drawing Sheets

(52) U.S. Cl.
CPC ....... *B41J 2/04581* (2013.01); *B41J 2/04588*
(2013.01); *H03K 17/302* (2013.01)
(58) Field of Classification Search
USPC .......................................................... 347/10
See application file for complete search history.

(56) References Cited

U.S. PATENT DOCUMENTS

| | | | |
|---|---|---|---|
| 2016/0136948 A1 | 5/2016 | Nitta | |
| 2020/0307189 A1* | 10/2020 | Nitta .................... | B41J 2/04541 |
| 2022/0209667 A1* | 6/2022 | Neidorff ................ | H02M 1/44 |
| 2023/0084935 A1 | 3/2023 | Kikuchi | |

OTHER PUBLICATIONS

Chinese First Office Action dated May 21, 2026, mailed in counterpart Chinese Application No. 202410597431.4, 13 pages.

\* cited by examiner

| SWITCH | GATE LEVEL | WAVEFORM OUTPUT LEVEL | ON RESISTANCE |
|--------|-----------|-----------------------|---------------|
| QA | NAg | VSS | 1000 Ω |
| QB | NBg | VSS | 200 Ω |
| QC | PCg | VA | 1000 Ω |
| QD | PDg | VA | 200 Ω |
| QE | PEg | VB | 1000 Ω |
| QF | PFg | VB | 200 Ω |

*FIG. 5*

| WAVEFORM OUTPUT LEVEL | SWITCH SIZE | ON SWITCH | | PARALLEL RESISTANCE |
|-----------------------|-------------|-----------|------|---------------------|
| VSS | 3 | QA | QB | 167 Ω |
| VSS | 2 | | QB | 200 Ω |
| VSS | 1 | QA | | 1000 Ω |
| VA | 3 | QC | QD | 167 Ω |
| VA | 2 | | QD | 200 Ω |
| VA | 1 | QC | | 1000 Ω |
| VB | 3 | QE | QF | 167 Ω |
| VB | 2 | | QF | 200 Ω |
| VB | 1 | QE | | 1000 Ω |

|  | | SA | SB | SC | SD |
|---|---|---|---|---|---|
| GRAYSCALE 1 (1 DROP) | TIMER | 2.00 | 2.00 | 2.00 | 2.00 |
|  | WAVEFORM OUTPUT LEVEL | VSS | VB | VA | VB |

| | | SA | SB | SC | SD |
|---|---|---|---|---|---|
| GRAYSCALE 1 (1 DROP) | TIMER | 2.00 | 2.00 | 2.00 | 2.00 |
| | WAVEFORM OUTPUT LEVEL | VSS | VB | VA | VB |
| | SWITCH SIZE | 1 | 3 | 1 | 1 |

|  |  | SA | SB | SC | SD | SE | SF | SG |
|---|---|---|---|---|---|---|---|---|
| GRAYSCALE 1 (1 DROP) | TIMER | 0.20 | 1.80 | 2.00 | 0.20 | 1.80 | 0.20 | 1.80 |
|  | WAVEFORM OUTPUT LEVEL | VSS | VSS | VB | VA | VA | VB | VB |
|  | SWITCH SIZE | 1 | 3 | 3 | 1 | 3 | 1 | 3 |

INKJET HEAD DRIVING CIRCUIT THAT AVOIDS UNWANTED HIGH-FREQUENCY ACTUATOR VIBRATION

CROSS-REFERENCE TO RELATED APPLICATION

This application is based upon and claims the benefit of priority from Japanese Patent Application No. 2023-144330, filed Sep. 6, 2023, the entire contents of which are incorporated herein by reference.

FIELD

Embodiments described herein relate generally to an inkjet head driving circuit.

BACKGROUND

In general, an inkjet head includes a pressure chamber that stores ink, an actuator that expands and contracts the pressure chamber, and an inkjet head driving circuit that drives the actuator. An inkjet head driving circuit ejects ink from a nozzle connected to the pressure chamber by causing the actuator to expand and contract the pressure chamber.

For the actuator, a piezoelectric actuator is normally used. It is usually desirable to make changes in the driving waveform of such an actuator faster in terms of the response speed of the actuator. However, when actuator changes are too fast, an unwanted high-frequency vibration may occur. Occurrence of such a high-frequency vibration may result in deterioration in the quality of printing by the inkjet head.

BRIEF DESCRIPTION OF THE DRAWINGS

FIG. 2 is a block diagram of an inkjet head driving circuit.

FIG. 4 is a table illustrating values for gate levels, waveform output levels, and ON resistance for switch elements in a gate driver.

FIG. 5 is a table illustrating values for waveform output levels, switch sizes, ON switches, and parallel resistances for pairs of switch elements in a gate driver.

DETAILED DESCRIPTION

In general, an exemplary embodiment provides an inkjet head driving circuit that avoids occurrence of unwanted high-frequency vibration in an actuator of an inkjet head.

In general, according to one embodiment, an inkjet head driving circuit includes a waveform pattern generation unit configured to generate a waveform pattern based on input data and a driving waveform generation unit configured to generate a driving waveform for driving an actuator of an inkjet head based on the generated waveform pattern. The driving waveform generation unit includes a power source configured to supply a driving voltage for the actuator, a plurality of switch elements for connecting the power source to the actuator, and a driving waveform output unit that outputs the driving waveform to the actuator by switching of the plurality of switch elements based on the waveform pattern. The waveform pattern changes the number of switch elements that are turned on in at least one section of a plurality of sections the driving waveform within one cycle of the driving waveform for causing the actuator to eject an ink droplet.

Inkjet Printer

Figure 1:
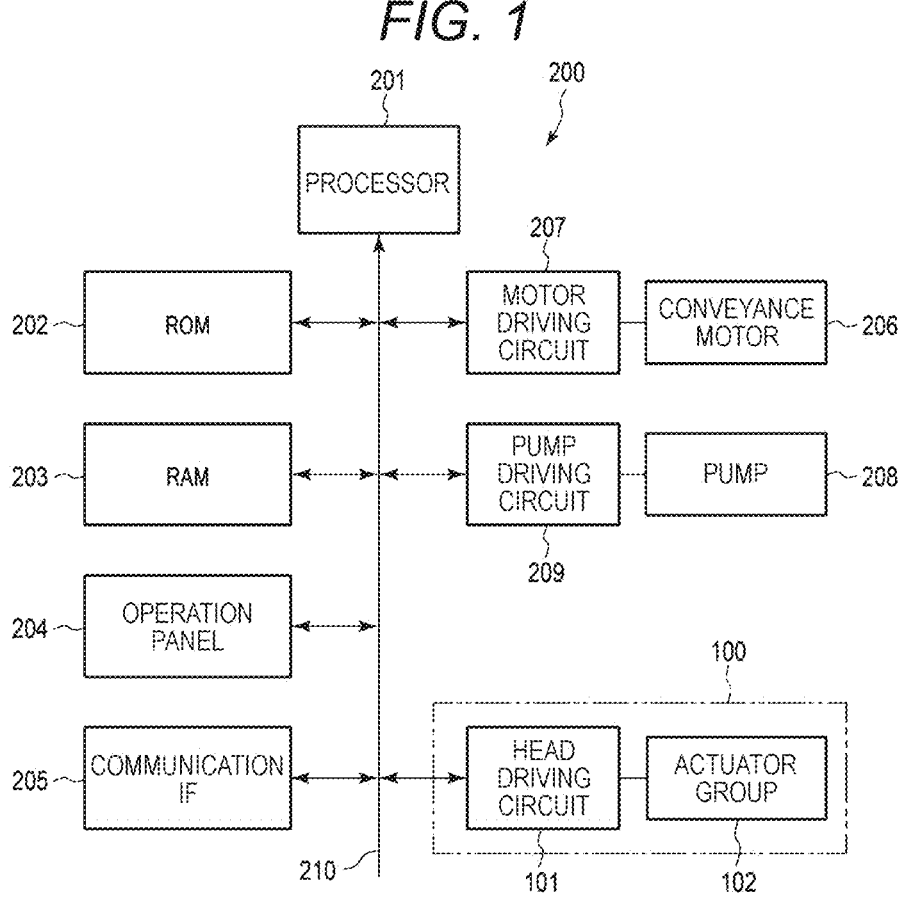
FIG. 1 is a block diagram of an inkjet printer including an inkjet head driving circuit according to an embodiment.

First, an inkjet printer 200 that includes an inkjet head 100 including an inkjet head driving circuit 101 according to the embodiment will be described with reference to FIG. 1. FIG. 1 is a block diagram illustrating a structure example of the inkjet printer 200. In the following description, inkjet printer 200 is abbreviated to printer 200, inkjet head 100 is abbreviated to head 100, and inkjet head driving circuit 101 is abbreviated to head driving circuit 101.

The printer 200 includes the head 100. The head 100 includes the head driving circuit 101 and an actuator group 102. The actuator group 102 includes a plurality of actuators. Each actuator is a driving element that expands and contracts a pressure chamber that stores ink. Ink is ejected from a nozzle connected to the pressure chamber as an ink droplet by the expansion and contraction by the corresponding actuator. For example, each actuator is a piezoelectric driving element made of lead zirconate titanate (PZT). The head driving circuit 101 is a circuit that generates a driving signal of the actuator group 102. Each actuator of the actuator group 102 operates according to a driving signal supplied from the head driving circuit 101 to expand and contract the pressure chamber and eject an ink droplet from a nozzle.

The printer 200 includes a processor 201, a read only memory (ROM) 202, a random access memory (RAM) 203, an operation panel 204, a communication interface 205, a conveyance motor 206, a motor driving circuit 207, a pump 208, and a pump driving circuit 209 in addition to the head 100. In the drawings, "interface" is abbreviated "IF".

The printer 200 includes a bus line 210 such as an address bus and a data bus. The processor 201, the ROM 202, the RAM 203, the operation panel 204, the communication interface 205, the motor driving circuit 207, the pump driving circuit 209, and the head driving circuit 101 are connected to the bus line 210 directly or via input/output circuits so that data can be transmitted and received.

The processor 201 corresponds to a central controller of a computer. The processor 201 controls each sub-unit or the like such that various functions of the printer 200 can be implemented according to an operating system and/or application programs. The processor 201 is, for example, a central processing unit (CPU).

The ROM 202 corresponds to a read-only main memory of a computer. The ROM 202 stores the operating system or application programs. The ROM 202 stores data necessary for the processor 201 to perform a process of controlling each unit.

The RAM 203 corresponds to a rewritable main memory of a computer. The RAM 203 stores data necessary for the processor 201 to perform a process. The RAM 203 is also used as a work area where the processor 201 can appropriately rewrite information. The work area includes an image memory on which printing data can be loaded.

The operation panel 204 includes a user operation unit and a display unit. The user operation unit can be provided with dedicated function keys such as a power key, a sheet feed key, and an error releasing key. The display unit can display various states of the printer 200.

The communication interface 205 receives printing data from a client terminal connected via a network such as a local area network (LAN). For example, when an error occurs in the printer 200, the communication interface 205 transmits a signal for notification of the error to the client terminal.

The motor driving circuit 207 controls driving of the conveyance motor 206. The conveyance motor 206 functions as a driving source of a conveyance mechanism that conveys a recording medium such as a sheet of printing paper or the like. When the conveyance motor 206 starts, the conveyance mechanism starts conveying the recording medium. The conveyance mechanism conveys the recording medium to a printing position facing the head 100. The conveyance mechanism discharges the printing medium on which printing has been completed from a discharge port or the like to the outside of the printer 200.

The pump driving circuit 209 controls driving of the pump 208. When the pump 208 is driven, ink from an ink tank or the like is supplied to the head 100.

The head driving circuit 101 drives the actuator group 102 based on the printing data. The actuator group 102 ejects an ink droplet from the nozzle connected to the pressure chamber by expanding and contracting the pressure chamber. Accordingly, the head 100 ejects the ink to the recording medium to print an image or the like on the recording medium.

Head Driving Circuit

Figure 2:
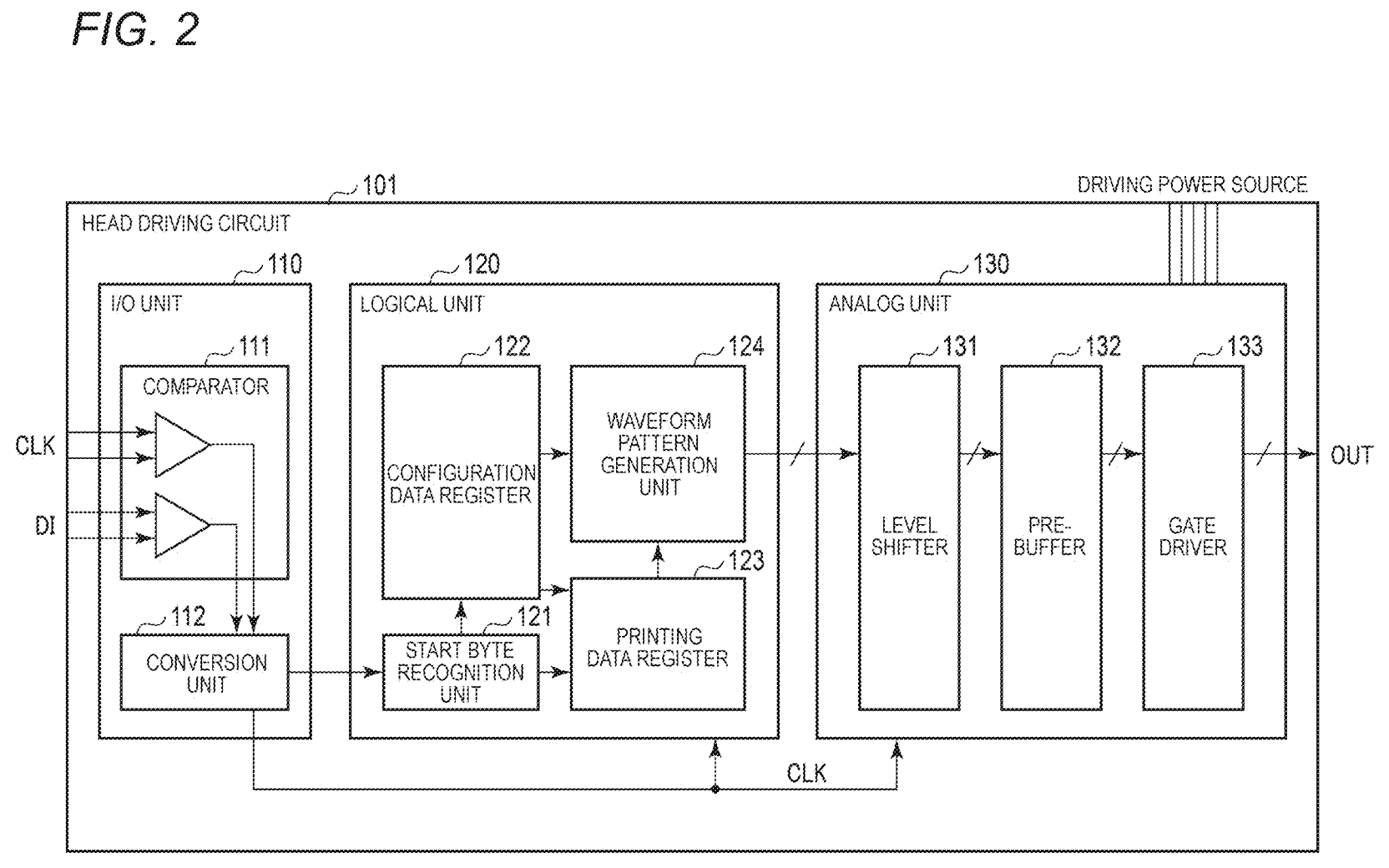

Next, the head driving circuit 101 according to the embodiment will be described with reference to FIG. 2. FIG. 2 is a block diagram illustrating a structure example of an inkjet head driving circuit 101 according to the embodiment.

The inkjet head driving circuit 101 includes an I/O unit 110, a logical unit 120, and an analog unit 130.

The I/O unit 110 includes a comparator 111 and a serial-parallel conversion unit 112. In the drawing, "serial-parallel conversion unit" is abbreviated to "conversion unit".

A low voltage differential signaling (LVDS) clock signal CLK and a data signal DI are input to the comparator 111. The data signal DI includes printing data, configuration data, and the like. The comparator 111 outputs data of the clock signal CLK and data of the data signal DI to the serial-parallel conversion unit 112.

The serial-parallel conversion unit 112 converts data with a serial format from the comparator 111 into data with a parallel format. The data of the data signal DI is acquired at a timing of a rise (leading edge) of the clock signal CLK. Specifically, when the clock signal CLK is changed from 0 to 1, the values (0 or 1) of the configuration data and the printing data included in the data signal DI are acquired. The serial-parallel conversion unit 112 outputs data of the data signal DI in a parallel format to the logical unit 120. The serial-parallel conversion unit 112 outputs data of the clock signal CLK to the analog unit of the logical unit 120.

The logical unit 120 includes a start byte recognition unit 121, a configuration data register 122, a printing data register 123, and a waveform pattern generation unit 124.

The start byte recognition unit 121 recognizes a start byte in the data signal DI with the parallel format from the serial-parallel conversion unit 112 and separates the data into the configuration data and the printing data. The start byte recognition unit 121 outputs the configuration data to the configuration data register 122 and outputs the printing data to the printing data register 123.

The configuration data register 122 stores the configuration data from the start byte recognition unit 121.

The printing data register 123 stores the printing data from the start byte recognition unit 121.

The waveform pattern generation unit 124 acquires the configuration data from the configuration data register 122, acquires the printing data from the printing data register 123, and generates a waveform pattern based on the configuration data and the printing data. The waveform pattern generation unit 124 outputs the generated waveform pattern to the analog unit 130.

The analog unit 130 is a driving waveform generation unit that generates a driving waveform based on the supplied waveform pattern. The analog unit 130 includes a level shifter 131, a pre-buffer 132, and a gate driver 133.

The level shifter 131 converts the waveform pattern from the waveform pattern generation unit 124 into a high voltage. The level shifter 131 outputs the waveform pattern converted into the high voltage to the pre-buffer 132.

The pre-buffer 132 appropriately amplifies and shapes the waveform pattern from the level shifter 131. The pre-buffer 132 outputs the appropriately amplified and shaped waveform pattern to the gate driver 133.

The gate driver 133 outputs a driving waveform for driving the actuator group 102 of the head 100 by controlling ON and OFF of a plurality of switch elements included in the gate driver 133 based on the waveform pattern from the pre-buffer 132. That is, the gate driver 133 is a driving waveform output unit that outputs a driving waveform based on the generated waveform pattern. For example, the switch elements are MOSFETs. The gate driver 133 controls the ON and OFF state (turning on and turning off) of the MOSFETs by applying control signals (gate voltages) to gates of the MOSFETs.

Gate Driver

Figure 3:
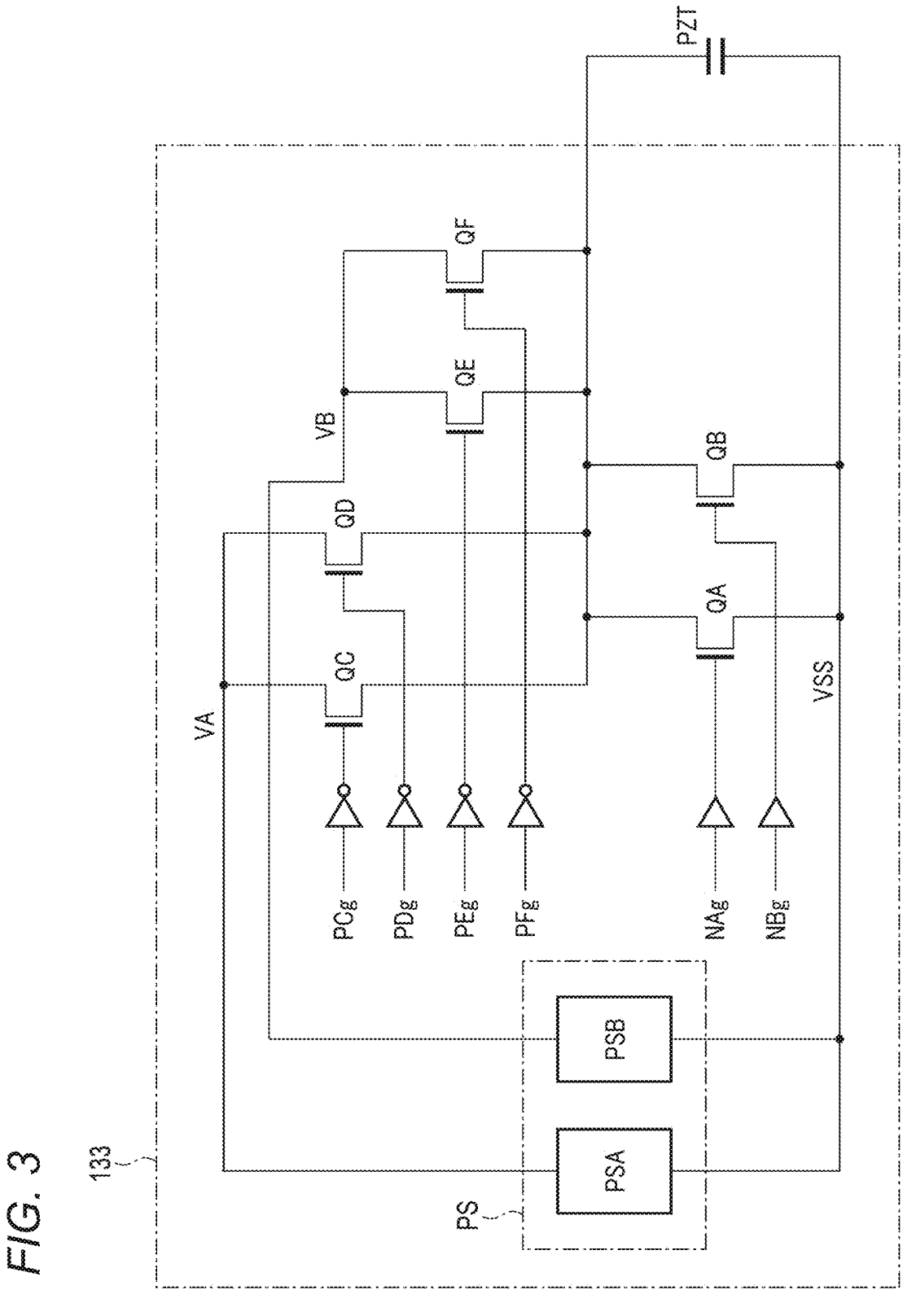
FIG. 3 is a block diagram of a gate driver in an inkjet head driving circuit.

Next, the gate driver 133 included in the head driving circuit 101 according to an embodiment will be described with reference to FIG. 3. FIG. 3 is a block diagram illustrating a structure example of the gate driver 133 included in the inkjet head driving circuit 101 according to an embodiment. The gate driver 133 illustrated in FIG. 3 is for one actuator PZT in the actuator group 102.

The gate driver 133 includes a power source PS and a plurality of switch elements (switching elements QA, QB, QC, QD, QE, and QF).

The power source PS includes a first power source PSA and a second power source PSB. The first power source PSA supplies a first voltage VA relative to a reference potential VSS. The second power source PSB supplies a second voltage VB relative to the reference potential VSS. The first voltage VA and the second voltage VB are different voltages. In some examples, the reference potential VSS can be a negative potential and the first voltage VA is higher than the second voltage VB.

The six different switch elements QA to QF comprise a first pair of switch elements (switch elements QA and QB), a second pair of switch elements (switch elements QC and QD), and a third pair of switch elements (switch elements QE and QF). The first pair of switch elements QA and QB are connected in parallel between a pair of electrodes of the actuator PZT. The second pair of switch elements QC and QD are connected in parallel between the actuator PZT and the first power source PSA. The third pair of switch elements QE and QF are connected in parallel between the actuator PZT and the second power source PSB.

Specifically, one electrode of the actuator PZT is connected to a power source terminal of the first power source PSA and a power source terminal of the second power source PSB, and is held at the reference potential VSS. The switch elements QC and QD are connected in parallel to the other electrode of the actuator PZT and the other power source terminal of the first power source PSA. The switch elements QE and QF are connected in parallel to the other electrode of the actuator PZT and the other power source terminal of the second power source PSB.

For the switch elements QA and QB, ON resistance of switch element QA is different from ON resistance of the switch element QB. For switch elements QC and QD, ON resistance of switch element QC is different from ON resistance of the switch element QD. For switch elements QE and QF, ON resistance of switch element QE is different from ON resistance of the switch element QF.

For example, the ON resistance of the switch element QA, the ON resistance of the switch element QC, and the ON resistance of the switch element QE are equal to each other.

The ON resistance of the switch element QB, the ON resistance of the switch element QD, and the ON resistance of the switch element QF are equal to each other.

For example, each of the switch elements QA to QF is a MOSFET (a metal-oxide-semiconductor field effect transistor). For each of the six switch elements QA to QF, an example value for a gate level, a waveform output level, and ON resistance is provided in FIG. 4. In this context, "gate level" is the level of a voltage applied to a gate of the switch element to turn on the switch element, the "waveform output level" is the level of the voltage applied to each switch element, and the "ON resistance" is the electrical resistance when the switch element is turned on.

For the switch element QA, the gate level is NAg, the waveform output level is VSS, and the ON resistance is 1000Ω. For the switch element QB, the gate level is NBg, the waveform output level is VSS, and the ON resistance is 200Ω. For the switch element QC, the gate level is PCg, waveform output level is VA, and the ON resistance is 1000Ω. For the switch element QD, the gate level is PDg, the waveform output level is VA, and the ON resistance is 200Ω. For the switch element QE, the gate level is PEg, the waveform output level is VB, and the ON resistance is 1000Ω. For the switch element QF, the gate level is PFg, the waveform output level is VB, and the ON resistance is 200Ω.

For each of the first pair of switch elements QA and QB, the second pair of switch elements QC and QD, and the third pair of switch elements QE and QF, a list of values for a waveform output level, a switch size, an ON switch, and parallel resistance is provided in FIG. 5. In this context, "ON switch" is the switch that turns on each pair of switch elements, and "parallel resistance" is the resistance provided by each pair of switch elements when switched ON.

For example, for the first pair of switch elements QA and QB, when both the switch elements QA and QB are turned on, the parallel resistance is 167Ω. When the switch element QA is turned off and the switch element QB is turned on, the parallel resistance is 200Ω. When the switch element QA is turned on and the switch element QB is turned off, the parallel resistance is 1000Ω. As illustrated in FIG. 5, the same is applied to the second pair of switch elements QC and QD and the third pair of switch elements QE and QF.

The "switch size" is an index value indicating a speed of rise and fall of a driving waveform for driving the actuator PZT. For a switch size 3, the rise and fall is faster than in a switch size 2. For a switch size 1, the rise and fall is slower than in the switch size 2.

The "switch size" values relates to the parallel resistance within each pair of switch elements. Specifically, the switch size will be larger when the parallel resistance of the pair of switch elements is low than when the parallel resistance is high. That is, rise and fall of each pair of switch elements is faster when the parallel resistance is low than when the parallel resistance is high.

Figure 6:
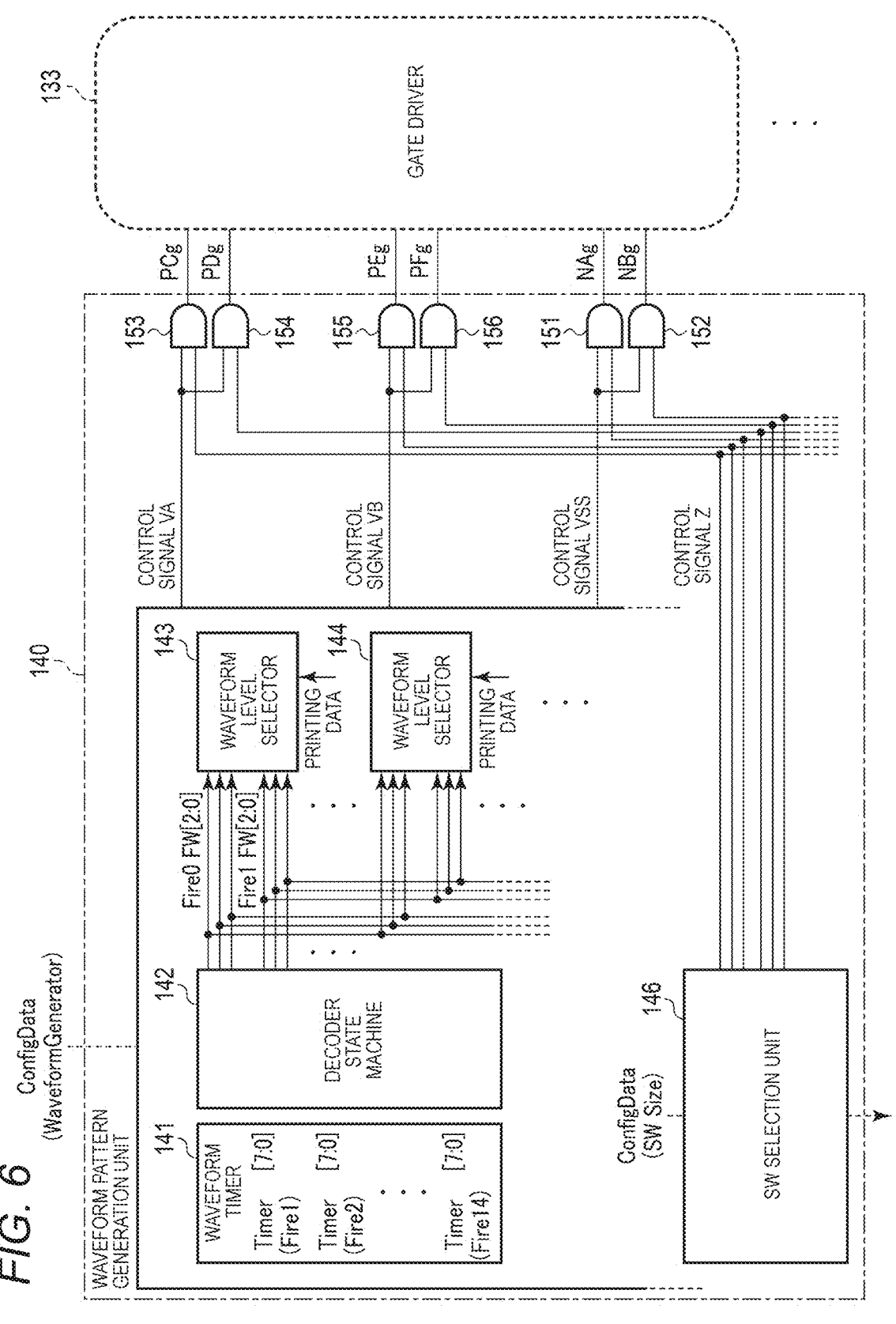
FIG. 6 is a block diagram of a waveform pattern generation unit in an inkjet head driving circuit according to an example of the related art.

Waveform Pattern Generation Unit in Head Driving Circuit According to Comparative Example Next, the waveform pattern generation unit 140 in the head driving circuit 101 according to an example (a comparative) from the related art will be described with reference to FIG. 6. FIG. 6 is a block diagram illustrating a structure example of the waveform pattern generation unit 140 in the inkjet head driving circuit 101 according to a comparative example.

The waveform pattern generation unit 140 includes six AND circuits 151 to 156 that respectively control ON and OFF of the six switch elements QA to QF in the gate driver 133.

The AND circuit 151 outputs the gate signal NAg that is input to the gate of the switch element QA to control ON and OFF of the switch element QA in the first pair of switch elements QA and QB of the gate driver 133. The AND circuit 152 outputs the gate signal NBg that is input to the gate of the switch element QB to control ON and OFF of the switch element QB in the first pair of switch elements QA and QB of the gate driver 133. In FIG. 6, for notation of a gate signal for the switch element QB, the gate levels NAg and NBg illustrated in FIG. 4 are re-used for convenience.

Similarly, the AND circuits 153 and 154 respectively output the gate signals PCg and PDg of the second pair of switch elements QC and QD of the gate driver 133. The AND circuits 155 and 156 respectively output the gate signals PEg and PFg of the third pair of switch elements QE and QF of the gate driver 133.

The waveform pattern generation unit 140 further includes a waveform timer 141, a decoder state machine 142, a waveform level selector 143, a waveform level selector 144, and an SW selection unit 146.

The waveform timer 141 is a timer circuit that generates a pulse signal for forming an ink droplet in conformity with a multi-drop scheme. Fire1, Fire2, . . . Fire14 correspond to ink droplets (grayscale values). Timer [7:0] indicates that the pulse signal is 8-bit data.

The decoder state machine 142 outputs data for designating a waveform output level to the waveform level selector 143 and the waveform level selector 144 based on the pulse signal generated by the waveform timer 141. Values for FW [2:0] corresponds to the waveform output levels VSS, VA, and VB illustrated in FIGS. 4 and 5 and indicates 3-bit data.

The waveform level selector 143 supplies the AND circuits 153 and 154 with the control signal VA for outputting the waveform output level VA to the AND circuits 153 and 154 based on the printing data.

The waveform level selector 144 supplies the AND circuits 155 and 156 with the control signal VB for outputting the waveform output level VB to the AND circuits 155 and 156 based on the printing data.

The waveform pattern generation unit 140 supplies the AND circuits 151 and 152 with the control signal VSS for outputting the waveform output level VSS to the AND circuits 151 and 152 based on the printing data by a waveform level selector or the like.

The SW selection unit 146 selects switch elements to be turned on among the six switch elements QA to QF in the gate driver 133 based on the configuration data. The SW selection unit 146 supplies the AND circuits 151 to 156 corresponding to the switch elements to be turned on with the control signal Z for outputting gate signals with gate levels to the switch elements to be turned on.

Through the above-described control, the logical unit 120 controls ON and OFF of the six switch elements QA to QF in the gate driver 133 of the analog unit 130 based on the printing data and the configuration data, and outputs a driving waveform for driving one actuator PZT in the actuator group 102 of the head 100.

Operation Example of Head Driving Circuit According to Comparative Example

In the waveform pattern generation unit 140 according to the comparative example illustrated in FIG. 6, the SW selection unit 146 sets a switch size to a constant value based on the configuration data when the head 100 is set (configured). Therefore, based on the waveform pattern generated by the waveform pattern generation unit 140 according to the comparative example, a speed of rise and fall of a driving waveform output by the gate driver 133 is constant.

Next, driving waveforms output by the head driving circuit 101 according to the comparative example will be described with reference to FIGS. 7 to 9. That is, driving waveforms output by the gate driver 133 based on waveform patterns generated by the waveform pattern generation unit 140 will be described. Here, for convenience, an example in which one actuator PZT ejects one ink droplet (example of grayscale level 1) will be described.

Figures 7, 8:
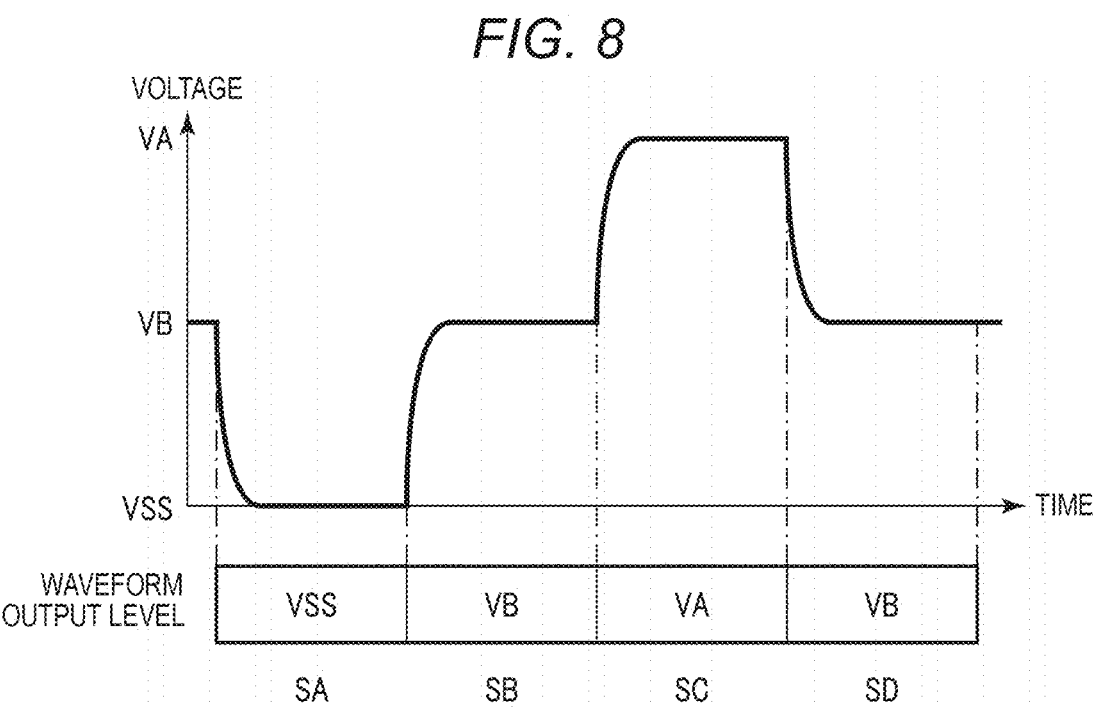
FIG. 7 is a table illustrating values of a waveform output levels and timer values for one cycle of a waveform pattern corresponding to one cycle of a driving waveform in an operation example of an inkjet head driving circuit.
FIG. 8 is a diagram illustrating a driving waveform output by a gate driver corresponding to an input of a waveform pattern at a particular switch size in an operation example of an inkjet head driving circuit.

FIG. 7 is a table illustrating values of a waveform output level and timer values (settings) for one cycle of a waveform pattern corresponding to one cycle of a driving waveform for causing one actuator PZT to eject one ink droplet.

One cycle of the waveform pattern includes four sections SA, SB, SC, and SD. Time lengths of each of the sections SA, SB, SC, and SD are all 2.00 μs in this example. The waveform output level in the section SA is VSS, the waveform output level in the section SB is VB, the waveform output level in the section SC is VA, and the waveform output level in the section SD is VSS.

For example, VSS represents a negative potential, VB represents a zero potential (ground), and VA represents a positive potential. For a pressure chamber, the section SA corresponds to an expansion section, the section SB corresponds to a release (relaxation) section, the section SC corresponds to a contraction section, and the section SD corresponds to a release (relaxation) section.

FIG. 8 is a diagram illustrating a driving waveform of the actuator PZT output by the gate driver 133 corresponding to the input of the waveform pattern illustrated in FIG. 7 when the SW selection unit 146 sets a switch size to the switch size 3. FIG. 9 is a diagram illustrating a driving waveform of the actuator PZT output by the gate driver 133 corresponding to the input of the waveform pattern illustrated in FIG. 7 when the SW selection unit 146 sets a switch size to the switch size 1. In FIGS. 8 and 9, waveform output levels are also illustrated in addition to driving waveforms.

Figure 9:
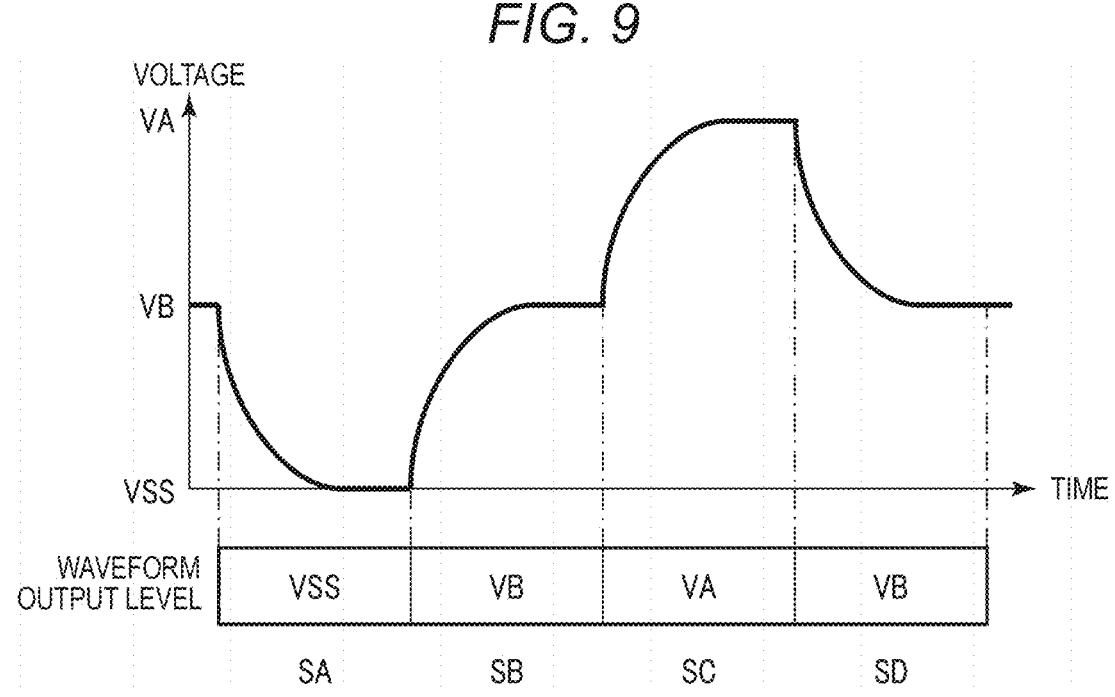
FIG. 9 is a diagram illustrating a driving waveform output by a gate driver corresponding to an input of a waveform pattern at a particular switch size in an operation example of an inkjet head driving circuit.

As understood in comparison between FIGS. 8 and 9, at any time of switching of a section where the waveform output level is changed, rise and fall of the driving waveform of FIG. 8 are faster than those of the driving waveform of FIG. 9. This means that the actuator PZT is driven at a faster response with the driving waveform of FIG. 8 than with the driving waveform of FIG. 9. This is desirable in terms of improvement of printing quality. However, when rise and fall of the driving waveform is too fast, there is concern with occurrence of unnecessary (unwanted) high-frequency vibration in the actuator PZT. The unnecessary high-frequency vibration is likely to cause deterioration in printing quality.

Figure 10:
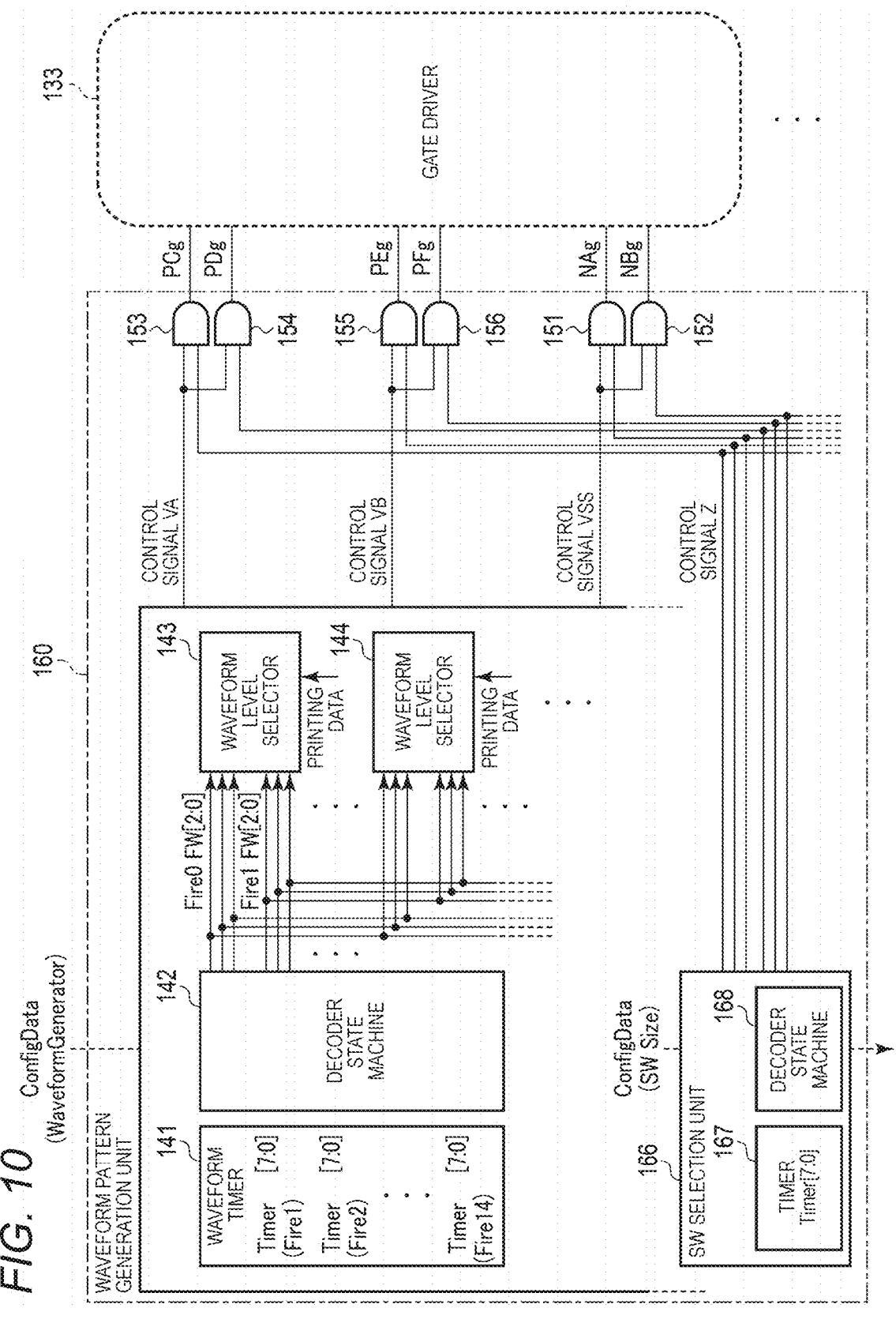
FIG. 10 is a block diagram of a waveform pattern generation unit according to a first structure example of an inkjet head driving circuit according to an embodiment.

Waveform Pattern Generation Unit Related to First Structure Example in Head Driving Circuit According to Embodiment Next, the waveform pattern generation unit 160 related to a first structure example in the head driving circuit 101 according to an embodiment will be described with reference to FIG. 10. FIG. 10 is a block diagram illustrating a structure example of the waveform pattern generation unit 160 according to the first structure example. In FIG. 10, aspects denoted by the same reference numerals as those illustrated in FIG. 6 are the same, and detailed description thereof will be omitted. Hereinafter, differences will be mainly described.

The waveform pattern generation unit 160 related to the first structure example includes a waveform timer 141, a decoder state machine 142, a waveform level selector 143, a waveform level selector 144, and six AND circuits (AND circuit 151, 152, 153, 154, 155, 156 somewhat similarly to the waveform pattern generation unit 140.

The details of the waveform timer 141, the decoder state machine 142, the waveform level selector 143, the waveform level selector 144, and six AND circuits 151 to 156 are as already described above.

The waveform pattern generation unit 160 related to the first structure example includes an SW selection unit 166 instead of the SW selection unit 146 of the waveform pattern generation unit 140. The SW selection unit 166 selects switch elements that are turned on among the six switch elements QA to QF in the gate driver 133 based on the configuration data. The SW selection unit 166 supplies the AND circuits 151 to 156 corresponding to the switch elements that are turned on with the control signal Z for outputting the gate signal with the gate level to the switch elements that are turned on. Here, the SW selection unit 166 is similar to the SW selection unit 146.

As described above, the SW selection unit 146 sets a constant value as a switch size based on the configuration data when the head 100 is set (configured). That is, the SW selection unit 146 cannot change the switch size. Therefore, the head driving circuit 101 including the waveform pattern generation unit 140 according to the comparative example of the related art sets a constant value as a speed of rise and fall of a driving waveform output from the gate driver 133.

However, the head driving circuit 101 including the waveform pattern generation unit 160 related to the first structure example can change a speed of rise and fall of a driving waveform output from the gate driver 133. That is, the head driving circuit 101 including the waveform pattern generation unit 160 according to the first structure example can change a switch size for one cycle of the driving waveform for causing the actuator PZT to eject one ink droplet.

In other words, the head driving circuit 101 including the waveform pattern generation unit 160 according to the first structure example can change parallel resistance of pairs of switch elements in the gate driver 133 for one cycle of the driving waveform, that is, for one cycle of the waveform pattern. Therefore, the head driving circuit 101 including the waveform pattern generation unit 160 according to the first structure example can change the number of switch elements that are turned on among the switch elements QA to QF in the gate driver 133 for one cycle of the waveform pattern. More specifically, the head driving circuit 101 including the waveform pattern generation unit 160 can change the switch elements that are turned on among the plurality of pairs of switch elements in the gate driver 133 for one cycle of the waveform pattern.

The SW selection unit 166 of the waveform pattern generation unit 160 related to the first structure example includes a timer 167 and a decoder state machine 168.

A time setting of the timer 167 can be the same as the time setting of the waveform timer 141. Therefore, Timer [7:0] signal for indicating the configuration time of the timer 167 indicates that the pulse signal is 8-bit data similarly to Timer [7:0] signal indicating the configuration time of the waveform timer 141.

The decoder state machine 168 outputs the control signal Z for changing the number of switch elements that are turned on among the six switch elements QA to QF in the gate driver 133 to the six AND circuits 151 to 156 for one cycle of the waveform pattern based on the time setting of the timer 167. In other words, the control signal Z is selection data for selecting the switch elements that are turned on among the switch elements QA to QF in the gate driver 133 for one cycle of the waveform pattern.

That is, in the waveform pattern generation unit 160 related to the first configuration example, the SW selection unit 166 generates the selection data for selecting the switch elements that are turned on among the switch elements QA to QF in the gate driver 133 for one cycle of the waveform pattern. That is, the SW selection unit 166 is a selection data generation unit that generates the selection data for selecting the switch elements that are turned on among the switch elements QA to QF in the gate driver 133 for one cycle of the waveform pattern.

Waveform Pattern Generation Unit Related to Second Structure Example in Head Driving Circuit According to Embodiment

Figure 11:
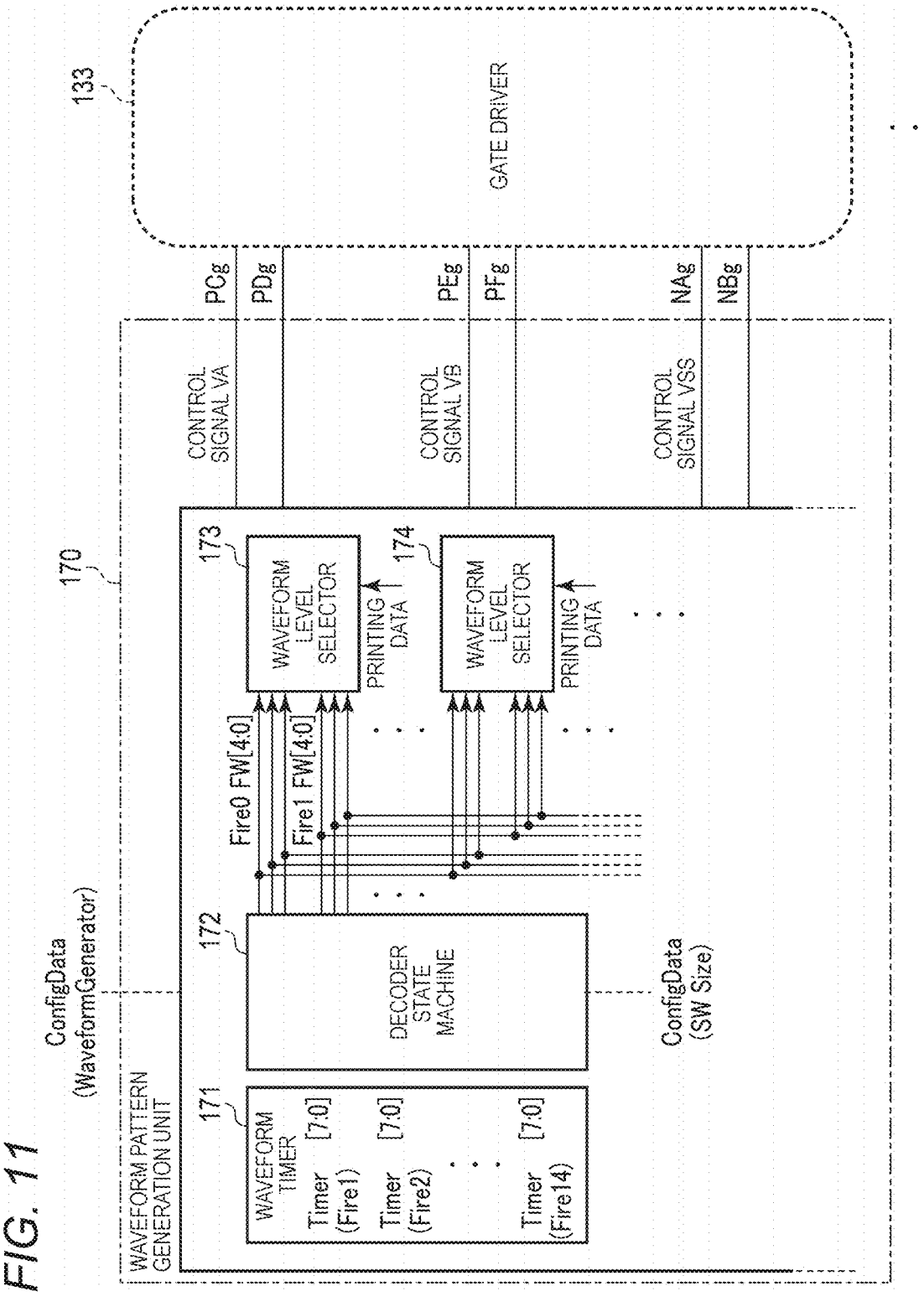
FIG. 11 is a block diagram of a waveform pattern generation unit according to a second structure example of an inkjet head driving circuit according to an embodiment.

Next, a waveform pattern generation unit 170 related to a second structure example in the head driving circuit 101 according to an embodiment will be described with reference to FIG. 11. FIG. 11 is a block diagram illustrating a structure example of the waveform pattern generation unit 170 according to the second structure example in the inkjet head driving circuit 101 according to the embodiment.

The waveform pattern generation unit 170 related to the second structure example includes a waveform timer 171, a decoder state machine 172, a waveform level selector 173, and a waveform level selector 174.

The functions and the like of the waveform timer 171 are similar to that of the waveform timer 141 of the waveform pattern generation unit 140.

The decoder state machine 172 outputs data for designating a waveform output level to the waveform level selector 173 and the waveform level selector 174 based on a pulse signal generated by the waveform timer 171. The decoder state machine 172 outputs data for designating the switch elements that are turned on among the six switch elements QA to QF in the gate driver 133 to the waveform level selector 173 and the waveform level selector 174 based on configuration data.

The decoder state machine 172 outputs 5-bit data as a FW [4:0] signal to the waveform level selector 173 and the waveform level selector 174. As described above, the data for designating the waveform output level is 3-bit data. Each pair of switch elements in the gate driver 133 are turned on or off together. Therefore, the data for designating the switch elements that are turned on is additional 2-bit data.

The waveform level selector 173 configures a waveform output level of the second pair of switch elements QC and QD in the gate driver 133 to VA based on the data from the decoder state machine 172 and printing data, and controls ON and OFF of the second pair of switch elements QC and QD.

The waveform level selector 174 configures a waveform output level of the third pair of switch elements QE and QF in the gate driver 133 to VB based on the data from the decoder state machine 172 and the printing data, and controls ON and OFF of the third pair of switch elements QE and QF.

In the waveform pattern generation unit 170, a waveform level selector or the like selects a waveform output level of the first pair of switch elements QA and QB in the gate driver 133 to VSS based on the data from the decoder state machine 172 and the printing data, and controls ON and OFF of the first pair of switch elements QA and QB.

With such a configuration, the waveform pattern generation unit 170 can operate similarly to the waveform pattern generation unit 160.

That is, the head driving circuit 101 including the waveform pattern generation unit 170 can change a switch size for one cycle of a driving waveform for causing the actuator PZT to eject one ink droplet. In other words, the head driving circuit 101 including the waveform pattern generation unit 170 can change parallel resistance of a pair of switch elements in the gate driver 133 for one cycle of the driving waveform. Therefore, the head driving circuit 101 including the waveform pattern generation unit 170 can change the number of switch elements that are turned on among the switch elements QA to QF in the gate driver 133 for one cycle of the driving waveform. More specifically, the head driving circuit 101 including the waveform pattern generation unit 170 can change the pair of switch elements that are turned on among the plurality of pairs of switch elements in the gate driver 133 for one cycle of the driving waveform.

First Operation Example of Head Driving Circuit According to Embodiment

Next, a first operation example of the head driving circuit 101 according to an embodiment will be described with reference to FIGS. 12 and 13. That is, a driving waveform output by the gate driver 133 based on the waveform patterns generated by the waveform pattern generation unit 160 and the waveform pattern generation unit 170 will be described. Here, for convenience, an example in which one actuator PZT ejects one ink droplet (an example of grayscale level 1) will be described.

Figures 12, 13:
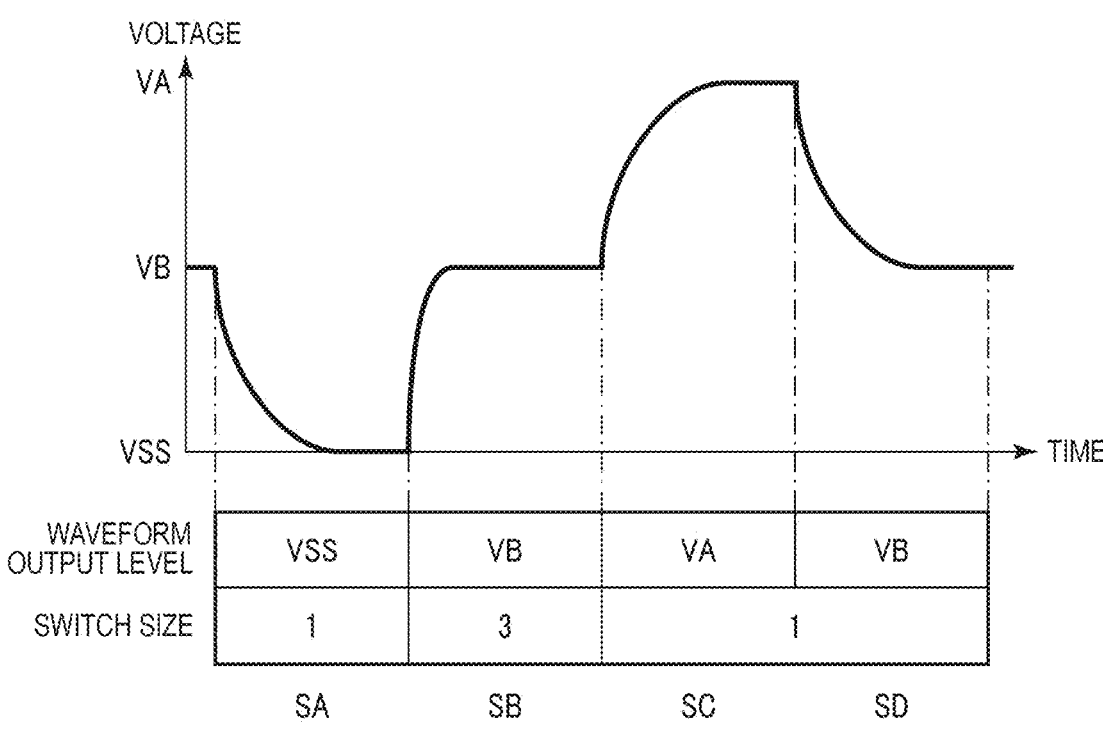
FIG. 12 is a table illustrating values of waveform output levels, switch sizes, and a timer values for one cycle of a waveform pattern corresponding to one cycle of a driving waveform in a first operation example related to an inkjet head driving circuit.
FIG. 13 is a diagram illustrating a driving waveform output by the gate driver corresponding to an input of a waveform pattern in a first operation example related to an inkjet head driving circuit.

FIG. 12 is a table illustrating values of waveform output levels, switch sizes, and a timer values (settings) for one cycle of a waveform pattern corresponding to one cycle of a driving waveform for causing one actuator PZT to eject one ink droplet in the first operation example.

In the first operation example, one cycle of the waveform pattern includes four sections (sections SA, SB, SC, and SD). Time lengths of each of the sections SA, SB, SC, and SD are all 2.00 µs. A waveform output level in the section SA is VSS, a waveform output level in the section SB is VB, a waveform output level in the section SC is VA, and a waveform output level in the section SD is VSS.

In this present example, VSS represents a negative potential, VB represents a zero potential, and VA represents a positive potential. For a pressure chamber that stores ink, the section SA corresponds to an expansion section, the section SB corresponds to a release section, the section SC corresponds to a contraction section, and the section SD corresponds to a release section. The pressure chamber ejects ink when the expansion section of the section SA is switched to the release section of the section SB.

As described above, the waveform pattern generation unit 160 related to the first structure example and the waveform pattern generation unit 170 related to the second structure example can change a switch size. The switch size in the section SA is 1, the switch size in the section SB is 3, the switch size in the section SC is 1, and the switch size in the section SD is 1.

FIG. 13 is a diagram illustrating a driving waveform of the actuator PZT output by the gate driver 133 corresponding to an input of the waveform pattern illustrated in FIG. 12. FIG. 13 illustrates waveform output levels and switch sizes in addition to the driving waveform.

The actuator PZT has a response that is fast for the switch size 3 and a response that is slow for the switch size 1. Therefore, in the driving waveform illustrated in FIG. 13, rise is fast only in the section SB with the switch size 3, and rise and fall are slow in the other sections SA, SC, and SD with the switch size 1.

Therefore, in the sections SA, SC, and SD, it is possible to inhibit occurrence of high-frequency vibration in the actuator PZT. On the other hand, since rise of a driving waveform is fast in the section SB, it is possible to avoid deterioration in printing quality due to distortion of the driving waveform.

As such, in the first operation example, the head driving circuit 101 according to an embodiment changes the number of switch elements that are turned on among the switch elements QA to QF in the gate driver 133 in different sections of the waveform pattern corresponding to one cycle of the driving waveform to eject one ink droplet from the actuator PZT. More specifically, the head driving circuit 101 according to an embodiment can change the pair of switch elements that are turned on among the plurality of pairs of switch elements in the gate driver 133 during the same cycle of the driving waveform.

Accordingly, the head driving circuit 101 related to the first operation example can inhibit occurrence of unwanted high-frequency vibration in the actuator PZT and avoid deterioration in printing quality by changing the parallel resistance of a pair of switch elements in the gate driver 133.

Second Operation Example of Head Driving Circuit According to Embodiment

Next, a second operation example of the head driving circuit 101 according to an embodiment will be described with reference to FIGS. 14 and 15. That is, a driving waveform output by the gate driver 133 based on the waveform patterns generated by the waveform pattern generation unit 160 related to the first structure example and the waveform pattern generation unit 170 related to the second configuration example will be described. Here, for convenience, an example in which one actuator PZT ejects one ink droplet (an example of grayscale level 1) will be described.

Figures 14, 15:
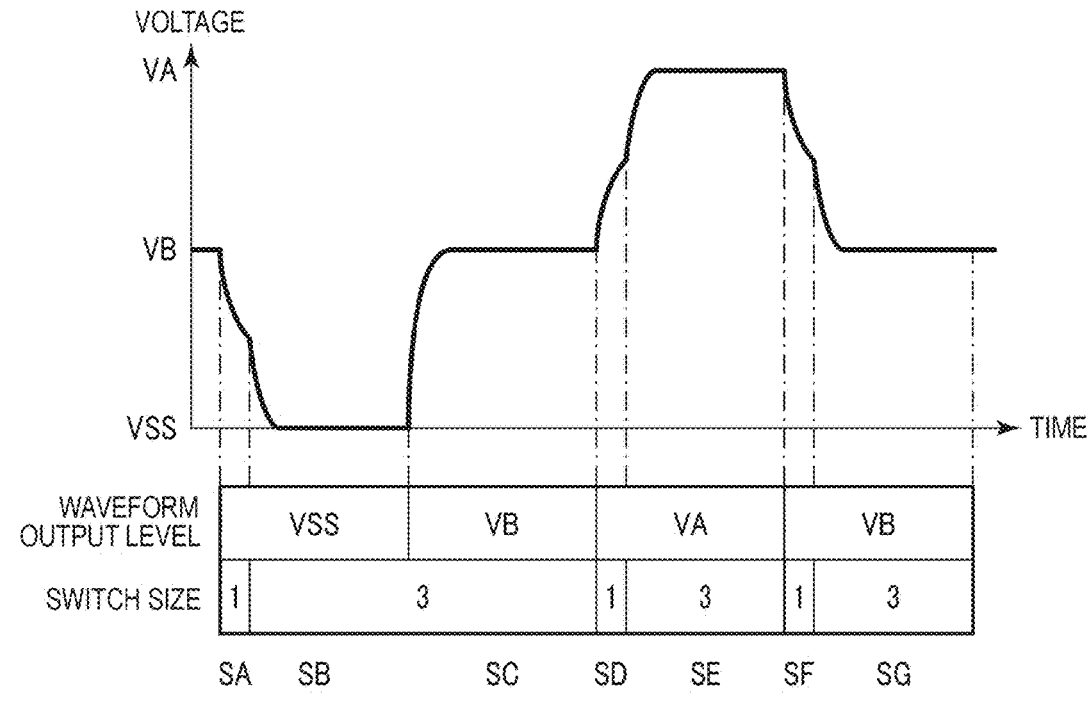
FIG. 14 is a table illustrating values of waveform output levels, switch sizes, and timer values for one cycle of a waveform pattern corresponding to one cycle of a driving waveform in a second operation example related to an inkjet head driving circuit.
FIG. 15 is a diagram illustrating a driving waveform output by a gate driver corresponding to an input of a waveform pattern in a second operation example related to an inkjet head driving circuit.

FIG. 14 is a table illustrating values of waveform output levels, switch sizes, and timer values (settings) for one cycle of a waveform pattern corresponding to one cycle of a driving waveform for causing one actuator PZT to eject one ink droplet in the second operation example.

In the second operation example, a cycle of the waveform pattern includes seven sections (sections SA, SB, SC, SD, SE, SF, and SG). Time lengths for the sections SA, SD, and SF are 0.20 µs, time lengths for the sections SB, SE, and SG are 1.80 µs, and a time length for the section SC is 2.00 µs. A waveform output level in the sections SA and SB is VSS, a waveform output level in the section SC is VB, a waveform output level in the sections SD and SE is VA, and a waveform output level in the sections SF and SG is VB. The switch size in the sections SA, SD, and SF is 1 and the switch size in the sections SB, SC, SE, and SG is 3.

In this present example, VSS represents a negative potential, VB represents a zero potential, and VA represents a positive potential. The sections SA and SB correspond to an expansion section, the section SC corresponds to a release section, the sections SD and SE correspond to a contraction section, and the sections SF and SG correspond to a release section. The pressure chamber ejects ink when the expansion section of the section SB is switched to the release section of the section SC.

FIG. 15 is a diagram illustrating a driving waveform of the actuator PZT output by the gate driver 133 corresponding to an input of the waveform pattern illustrated in FIG. 14. FIG. 15 illustrates waveform output levels and switch sizes in addition to the driving waveform.

In one cycle of the driving waveform, in the sections SA and SB in which an initial waveform output level is VSS, the switch size is 1 in the section SA at the initial 0.20 µs of the cycle. Therefore, the fall of the driving waveform voltage level is relatively gentle. In the section SB, during the next 1.80 µs after section SA, however, the switch size is 3. Therefore, the fall of the driving waveform voltage level is relatively fast.

In the section SC for the 2.00 μs in which the waveform output level continuing from the section SB is VB, the switch size is 3. Therefore, the rise of the driving waveform voltage level is fast.

In the sections SD and SE in which the waveform output level after the section SC is VA, the switch size is 1 in the section SE for 0.20 μs. Therefore, the rise of the driving waveform voltage level is relatively gentle. In the section SE for the next 1.80 μs after the section SD, however, the switch size is 3. Therefore, the rise of the driving waveform voltage level is relatively fast.

In the sections SF and SG in which the waveform output level continuing from the section SE is VB, the switch size is 1 in the section SF in the initial 0.20 μs. Therefore, the fall of the driving waveform voltage level is relatively gentle. In the section SG for the 1.80 μs after the section SF, however, the switch size is 3. Therefore, the fall of the driving waveform voltage level is relatively fast.

As such, in the second operation example, the head driving circuit 101 according to an embodiment changes the switch size in at least one section among the plurality of sections based on the waveform output level during one cycle of the waveform pattern corresponding to one cycle of the driving waveform to eject one ink droplet from an actuator PZT. Specifically, the head driving circuit 101 related to the second operation example changes the switch size in the three sections among the sections SA and SB, sections SD and SE, and sections SF and SG based on the waveform output level.

More specifically, the head driving circuit 101 related to the second operation example changes the switch size, that is, the number of switch elements that are turned on among the switch elements QA to QF in the gate driver 133, during an initial period and a period continuing from the initial period in each of the three groups of sections SA and SB, SD and SE, and sections SF and SG. More specifically, the head driving circuit 101 related to the second operation example changes the pair of switch elements that are turned on among the plurality of pairs of switch elements in the gate driver 133 during one cycle of the driving waveform.

More specifically, the head driving circuit 101 related to the second operation example increases the switch size during the section SC contributing to ejection of ink, decreases the switch size in initial periods of the other section groups, and increases the switch size in the periods after the initial periods of the other section groups.

Accordingly, the head driving circuit 101 related to the second operation example can avoid deterioration in printing quality while inhibiting occurrence of unnecessary high-frequency vibration in the actuator PZT.

Advantages

As described above, the head driving circuit 101 according to an embodiment changes the number of switch elements that are turned on among the switch elements QA to QF in the gate driver 133 during different sections (phases) of the waveform pattern corresponding to one cycle of the driving waveform for causing the actuator PZT to eject one ink droplet. For example, the head driving circuit 101 according to an embodiment changes the number of switch elements that are turned on in at least one section among a plurality of sections based on the waveform output level. Accordingly, it is possible to appropriately adjust a rise and/or fall speed during an appropriate portion of a cycle of the driving waveform. By decreasing the speed of rise or fall at the appropriate portion of a cycle of the driving waveform, it is possible to inhibit occurrence of unnecessary high-frequency vibration in each actuator PZT of the actuator group 102 of the head 100. By increasing the speed of rise or fall at the appropriate portion of a cycle of the driving waveform, it is possible to avoid deterioration in printing quality.

Modified Example

In an embodiment, the gate driver 133 includes six switch elements, that is, three pairs of switch elements, and the waveform output levels input to the gate driver 133 are three potentials. The present disclosure is not limited thereto. That is, the gate driver 133 may include more than three pairs of switch elements, and the waveform output levels input to the gate driver 133 may be more than three different potentials. For example, the gate driver 133 may include five pairs of switch elements and the waveform output levels input to the gate driver 133 may be five different potentials.

OTHERS

A software program corresponding to an embodiment may be transferred as a program stored in an electronic device or may be separately from an electronic device. In the latter case, the program may be transferred via a network or in a storage medium. The storage medium can be a non-transitory computer-readable medium, such as a CD-ROM or a memory card, but the form of the storage medium is not particularly limited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inkjet head driving circuit, comprising:
   a waveform pattern generation circuit configured to generate a waveform pattern based on input data; and
   a driving waveform generation circuit configured to generate a driving waveform for driving an actuator of an inkjet head based on the generated waveform pattern, wherein
   the driving waveform generation circuit includes:
   a power source configured to supply a driving voltage for the actuator, and
   a driving waveform output circuit including a plurality of switch elements for connecting the power source to the actuator, the driving waveform output circuit being configured to output the driving waveform to the actuator by switching of the plurality of switch elements based on the waveform pattern,
   the waveform pattern changes the number of switch elements among the plurality of switch elements that are turned on in at least one section of the driving waveform among a plurality of sections within one cycle of the driving waveform for causing the actuator to eject an ink droplet,
   the power source comprises a first power source that supplies a first voltage and a second power source that supplies a second voltage,
   the plurality of switches includes:

a first pair of switch elements connected in parallel with the actuator, a second pair of switch elements connected in parallel between the actuator and the first power source, and a third pair of switch elements connected in parallel between the actuator and the second power source, in the first pair of switch elements, ON resistance of one switch element is different from ON resistance of the other switch element, in the second pair of switch elements, ON resistance of one switch element is different from ON resistance of the other switch element, and in the third pair of switch elements, ON resistance of one switch element is different from ON resistance of the other switch element.

2. The inkjet head driving circuit according to claim 1, wherein the ON resistance of one switch element in the first pair of switch elements, the ON resistance of one switch element in the second pair of switch elements, and the ON resistance of one switch element of the third pair of switch elements are equal to each other.

3. The inkjet head driving circuit according to claim 2, wherein the ON resistance of the other switch element in the first pair of switch elements, the ON resistance of the other switch element in the second pair of switch elements, and the ON resistance of the other switch element of the third pair of switch elements are equal to each other.

4. The inkjet head driving circuit according to claim 1, wherein the waveform pattern generation circuit includes a selection data generation circuit that generates selection data for selecting a switch element to be turned on for one cycle of the waveform pattern.

5. The inkjet head driving circuit according to claim 1, wherein the waveform pattern generated by the waveform pattern generation circuit includes selection data for selecting a switch element to be turned on.

6. An inkjet head driving circuit, comprising:

a logical unit circuit configured to generate control signals for driving a plurality of actuators of an inkjet head for ejecting liquid; and an analog unit circuit configured to receive the control signals from the logical unit circuit and to output a drive waveform for an actuator of the inkjet head corresponding to the control signals, wherein the analog unit circuit includes a plurality of switches including:

a first switch connected between a first terminal of the actuator and a second terminal of the actuator;

a second switch connected in parallel with the first switch between the first terminal of the actuator and the second terminal of the actuator;

a third switch connected between the first terminal of the actuator and a first power supply line;

a fourth switch connected in parallel with the third switch between the first terminal of the actuator and the first power supply line;

a fifth switch connected between the first terminal of the actuator and a second power supply line; and a sixth switch connected in parallel with the fifth switch between the first terminal of the actuator and the second power supply line, wherein the second terminal of the actuator is connected to a third power supply line, the control signals from the logical unit circuit change the number of switches among the plurality of switches that are turned on in at least one section of the driving waveform among a plurality of sections within one cycle of the driving waveform for causing the actuator to eject an ink droplet, ON resistance of first switch is different from ON resistance of the second switch, ON resistance of third switch is different from ON resistance of the fourth switch, ON resistance of fifth switch is different from ON resistance of the sixth switch, the first power supply line is connected to a first potential, the third power supply line is connected to a second potential, and the second power supply line is connected to a third potential that is between the first and second potentials.

7. The inkjet head driving circuit according to claim 6, wherein the ON resistance of the first, third, and fifth switches are equal to each other.

8. The inkjet head driving circuit according to claim 7, wherein the ON resistance of the second, fourth, and sixth switches are equal to each other.

9. The inkjet head driving circuit according to claim 7, wherein the logical unit circuit includes a selection data generation unit circuit that generates selection data for selecting switches among the plurality of switches to be turned on during one cycle of the drive waveform.

10. The inkjet head driving circuit according to claim 6, wherein the analog unit circuit further includes:

a level shifter configured to receive the control signals from the logical unit circuit; and a pre-buffer configured to receive the control signals from the level shifter.

11. The inkjet head driving circuit according to claim 6, wherein the second potential is a ground potential.

12. An inkjet printer, comprising:

an inkjet head configured to eject liquid, the inkjet head including:

an actuator group with a plurality actuators; and a head driving circuit configured to drive the plurality of actuators to eject liquid from pressure chambers associated with the plurality of actuators, wherein the head driving circuit includes:

a logical unit circuit configured to generate control signals for driving the plurality of actuators for ejecting liquid; and an analog unit circuit configured to receive the control signals from the logical unit circuit and to output a drive waveform for an actuator corresponding to the control signals, the analog unit circuit includes a plurality of switches including:

a first switch connected between a first terminal of the actuator and a second terminal of the actuator;

a second switch connected in parallel with the first switch between the first terminal of the actuator and the second terminal of the actuator;

a third switch connected between the first terminal of the actuator and a first power supply line;

a fourth switch connected in parallel with the third switch between the first terminal of the actuator and the first power supply line;

a fifth switch connected between the first terminal of the actuator and a second power supply line; and a sixth switch connected in parallel with the fifth switch between the first terminal of the actuator and the second power supply line, wherein the second terminal of the actuator is connected to a third power supply line, and the control signals from the logical unit circuit change the number of switches among the plurality of switches that are turned on in at least one section of the driving waveform among a plurality of sections within one cycle of the driving waveform for causing the actuator to eject an ink droplet, ON resistance of first switch is different from ON resistance of the second switch, ON resistance of third switch is different from ON resistance of the fourth switch, ON resistance of fifth switch is different from ON resistance of the sixth switch, the first power supply line is connected to a first potential, the third power supply line is connected to a second potential, and the second power supply line is connected to a third potential that is between the first and second potentials.

13. The inkjet printer according to claim 12, wherein the ON resistance of the first, third, and fifth switches are equal to each other.

14. The inkjet printer according to claim 13, wherein the ON resistance of the second, fourth, and sixth switches are equal to each other.

15. The inkjet printer according to claim 12, wherein the logical unit circuit includes a selection data generation unit circuit that generates selection data for selecting switches among the plurality of switches to be turned on during one cycle of the drive waveform.

\*   \*   \*   \*   \*